(12) United States Patent
Lundberg

(10) Patent No.: US 6,998,875 B2
(45) Date of Patent: Feb. 14, 2006

(54) OUTPUT DRIVER IMPEDANCE CONTROLLER

(75) Inventor: James R. Lundberg, Austin, TX (US)

(73) Assignee: IP-First, LLC, Fremont, CA (US)

(*) Notice: Subject to any disclaimer, the term of this patent is extended or adjusted under 35 U.S.C. 154(b) by 118 days.

(21) Appl. No.: 10/730,389

(22) Filed: Dec. 5, 2003

(65) Prior Publication Data

US 2004/0113653 A1 Jun. 17, 2004

Related U.S. Application Data

(60) Provisional application No. 60/432,695, filed on Dec. 10, 2002.

(51) Int. Cl.
*H03K 19/0175* (2006.01)
(52) U.S. Cl. ............................. 326/87; 326/83; 326/30; 326/26
(58) Field of Classification Search ................. 326/26, 326/27, 30, 82–90, 3
See application file for complete search history.

(56) References Cited

U.S. PATENT DOCUMENTS

| | | | |
|---|---|---|---|
| 4,719,369 A * | 1/1988 | Asano et al. ................. 326/30 |
| 5,194,765 A | 3/1993 | Dunlop et al. |
| 5,444,397 A | 8/1995 | Wong et al. |
| 5,457,407 A * | 10/1995 | Shu et al. ..................... 326/30 |
| 5,479,123 A | 12/1995 | Gist et al. |
| 5,657,456 A | 8/1997 | Gist et al. |
| 5,666,078 A | 9/1997 | Lamphier et al. |
| 5,955,894 A | 9/1999 | Vishwanthaiah et al. |
| 6,087,847 A | 7/2000 | Mooney et al. |
| 6,088,756 A | 7/2000 | Munoz-Bustamante |
| 6,133,749 A | 10/2000 | Hansen et al. |
| 6,163,499 A | 12/2000 | Suzuki |
| 6,326,802 B1 * | 12/2001 | Newman et al. ............... 326/30 |
| 6,384,621 B1 * | 5/2002 | Gibbs et al. .................. 326/30 |
| 6,509,778 B1 * | 1/2003 | Braceras et al. ............ 327/308 |
| 6,624,662 B1 * | 9/2003 | Volk ............................ 326/87 |
| 6,661,250 B1 | 12/2003 | Kim et al. |
| 6,667,633 B1 * | 12/2003 | Fifield et al. ................. 326/30 |
| 6,690,211 B1 * | 2/2004 | Huang et al. ............... 327/108 |

* cited by examiner

*Primary Examiner*—Don Le
(74) *Attorney, Agent, or Firm*—Gary R. Stanford; Richard K. Huffman; James W. Huffman

(57) ABSTRACT

An output driver impedance controller for controlling pull-down impedance of at least one output based on a reference value including a programmable reference impedance generator, at least one output driver coupled to a corresponding output, and an impedance matching controller. The programmable reference impedance generator develops a reference impedance controlled by a reference impedance control input. Each output driver includes a programmable output impedance generator coupled to an output and controlled by an output impedance control input. The impedance matching controller continually adjusts the reference impedance control input to match the reference impedance with the reference value within a predetermined tolerance and generates the output impedance control input based on the reference impedance control input. Each of the programmable generators may be implemented with a binary array of matched impedance devices. The reference value may be an externally coupled resistor and/or an internal reference resistor.

27 Claims, 5 Drawing Sheets

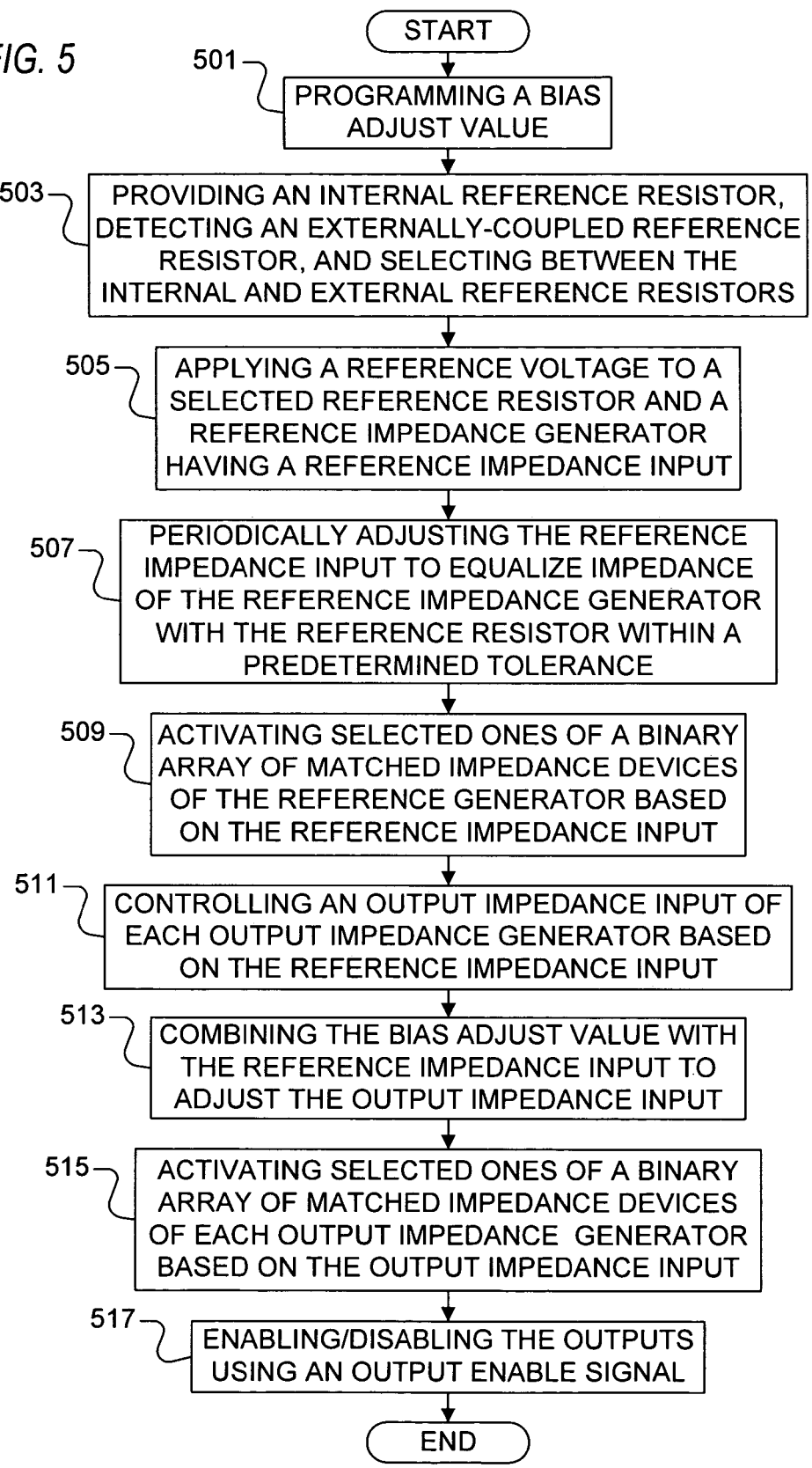

OUTPUT DRIVER IMPEDANCE CONTROLLER

CROSS-REFERENCE TO RELATED APPLICATIONS

This application claims the benefit of U.S. Provisional Application No. 60/432,695, filed on Dec. 10, 2002, which is herein incorporated by reference for all intents and purposes.

This application is related to the following co-pending U.S. Patent Applications, which are filed on the same day as this application, which has a common assignee and at least one common inventor, and which is herein incorporated by reference in its entirety for all intents and purposes:

| SERIAL NUMBER | DOCKET NUMBER | TITLE |
| --- | --- | --- |
| 10/730,169 | CNTR.2117 | APPARATUS AND METHOD FOR PRECISELY CONTROLLING TERMINATION IMPEDANCE |
| 10/730,435 | CNTR.2118 | APPARATUS AND METHOD FOR ADJUSTING THE IMPEDANCE OF AN OUTPUT DRIVER |

BACKGROUND OF THE INVENTION

1. Field of the Invention

The present invention relates to IC output driver circuits, and more particularly to an output driver impedance controller which provides precise control of the pull-down impedance for outputs of an IC.

2. Description of the Related Art

In earlier integrated circuit (IC) designs, CMOS output drivers were configured as push-pull elements. Consequently, the noise seen on an output bus fluctuated significantly in response to various factors, including circuit temperature, supply voltage, fabrication process differences, the number of devices on the bus, etc. In more recent years, as technological advances have resulted in the scaling of device size and voltage levels, designers have been forced to aggressively address noise problems on external busses in order to maximize the operating speed of circuits within a system.

One aspect of more recent output driver solutions has been a move in the industry from push-pull output configurations to differential receiver configurations. In a differential receiver configuration, one side of a differential receiver is supplied with a reference voltage and the other side is driven by an open drain N-channel device. The open drain N-channel devices are provided on-chip and bus pull-up terminations are generally provided externally, typically on a system motherboard or the like. Providing pull-up terminations on a motherboard grants system designers a level of flexibility to address bus noise problems that has heretofore been unavailable.

The aforementioned types of output drivers have become prevalent within the industry. One particular example of this prevalence is exhibited by the Pentium® II x86 microprocessor, a product of the Intel® Corporation. The Pentium II employs open drain N-channel output devices to drive a 1.5 Volt (V) bus having a 1.0 V reference threshold. Motherboards for this processor generally employ 56 ohm pull-up terminations. Although no particular pull down impedance has been specified, open drain output drivers have been used to comply with bus switching and timing specifications. Without compensating for process, voltage, and temperature variations, however, the channel resistance of an open drain N-channel output driver can vary anywhere from approximately 4 to 80 ohms. And since microprocessor designers can only anticipate acceptable limits for process, voltage, and temperature fluctuations, they have been compelled in Pentium II motherboard-compatible designs to add slew rate controls on the order of 2–3 nanoseconds (ns) to output signal edges to reduce noise on output buses.

With the Pentium III®, Intel introduced a means whereby designers are provided with a reference impedance that can be used to set the impedance of the output drivers on the bus. A pin on the processor package, referred to as NCHCTRL, is connected to the bus voltage, referred to as VTT, through a precision 14 ohm resistor, with a maximum specified resistance of 16 ohms. The precision resistor is external to the microprocessor chip and is therefore independent of the temperature and voltage variations seen by output drivers on the chip.

SUMMARY OF THE INVENTION

An output driver impedance controller for controlling pull-down impedance of at least one output based on a reference value according to an embodiment of the present invention includes a programmable reference impedance generator, at least one output driver coupled to a corresponding output, and an impedance matching controller. The programmable reference impedance generator develops a reference impedance controlled by a reference impedance control input. Each output driver includes a programmable output impedance generator coupled to an output and controlled by an output impedance control input. The impedance matching controller continually adjusts the reference impedance control input to match the reference impedance with the reference value within a predetermined tolerance and generates the output impedance control input based on the reference impedance control input.

In one embodiment, the programmable reference impedance generator and each programmable output impedance generator includes a binary array of matched impedance devices, such as matched N-channel devices. The impedance matching controller may include a voltage sensor and impedance control logic. In this case, the voltage sensor senses a voltage difference between a reference voltage based on an input bus voltage and a voltage of the programmable reference impedance generator and asserts an error signal indicative thereof. The impedance control logic adjusts the reference impedance control input based on the error signal. In one embodiment, the reference value is a reference resistor coupled in series with the programmable reference impedance generator, and the input bus voltage is applied across the series combination.

Bias adjustment logic may be provided that combines a bias amount with the reference impedance control input to provide the output impedance control input. Also, output bias logic may be included to provide the bias amount, such as programmable fuses or the like.

The impedance matching controller may include a first controller for coupling to an external reference resistor for providing a first reference value, and a second controller including an internal reference resistor for providing a second reference value. In this case, the first controller may further include detection logic that monitors the reference impedance control input to determine whether the first reference value is coupled and that enables the second controller if the first reference value is not coupled.

An integrated circuit (IC) according to an embodiment of the present invention includes a first reference pin for receiving a reference voltage, at least one output pin, at least one output driver, and impedance matching logic. Each output driver includes a programmable output impedance generator controlled by an output impedance control input and coupled to drive a corresponding output pin. The impedance matching logic includes a programmable reference impedance generator, comparator logic, and output logic. The programmable reference impedance generator is controlled by a reference impedance control input. The comparator logic continually adjusts the reference impedance control input to equalize values of a reference resistor coupled to the first reference pin and the programmable reference impedance generator within a predetermined tolerance. The output logic controls the output impedance control input based on the reference impedance control input.

The reference voltage may be applied across a series coupling of the reference resistor and the programmable reference impedance generator. In this case, the comparator logic attempts to equalize voltages within a predetermined voltage tolerance. The IC may further include a second reference pin coupled to the programmable reference impedance generator and for coupling to one end of an external reference resistor having its other end coupled to the first reference pin.

The IC may further include an internal reference resistor. The programmable reference impedance generator may include a first generator controlled by a first reference impedance control input and coupled to the second reference pin, and a second programmable reference impedance generator controlled by a second reference impedance control input and coupled to the second end of the internal reference resistor. In this case, the comparator logic may include first comparator logic that adjusts the first reference impedance control input in an attempt to equalize voltages of the external reference resistor and the first programmable reference impedance generator within a first tolerance, and second comparator logic that adjusts the second reference impedance control input in an attempt to equalize voltages of the internal reference resistor and the second programmable reference impedance generator within a second tolerance. The IC may further include detection logic that monitors the first reference impedance control input for detecting presence of the external reference resistor and providing an enable signal indicative thereof. The output logic selects one of the first and second reference impedance control inputs based on the enable signal for providing the output impedance control input.

The IC may further include output bias logic that provides an adjustment value, where the output logic includes bias adjustment logic that combines the reference impedance control input with the adjustment value to provide the output impedance control input.

A method of controlling pull-down impedance of at least one output driver includes applying a reference voltage to a reference resistor and a reference impedance generator having a reference impedance input, periodically adjusting the reference impedance input to equalize impedance of the reference impedance generator with the reference resistor within a predetermined tolerance, and controlling an output impedance input of at least one output impedance generator based on the reference impedance input, where each output impedance generator is coupled to a corresponding output driver.

The method may further include sensing voltage at a common junction of the reference impedance generator and the reference resistor coupled in series with the reference voltage, and comparing the voltage at the common junction with one-half of the reference voltage. The method may further include providing an internal reference resistor, detecting an externally-coupled reference resistor and providing an enable signal indicative thereof, and selecting between the internal and external reference resistors based on the enable signal. The periodically adjusting the reference impedance input may be implemented by incrementing or decrementing a digital value during selected cycles of a clock signal.

The method may include programming a bias adjust value, where the controlling an output impedance input includes combining the bias adjust value with the reference impedance input. The method may further include enabling or disabling each output driver based on an output enable signal. The method may further include activating selected ones of a binary array of matched impedance devices of the reference impedance generator based on the reference impedance input and activating selected ones of a binary array of matched impedance devices of each output impedance generator based on the output impedance input.

BRIEF DESCRIPTION OF THE DRAWINGS

The benefits, features, and advantages of the present invention will become better understood with regard to the following description, and accompanying drawings where:

FIG. 5 is a flowchart diagram illustrating a method of controlling pull-down impedance of at least one output driver according to an exemplary embodiment of the present invention.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventor of the present application has recognized the need for providing a precise bus pull-down impedance and for using the externally-coupled resistor as a reference for setting the pull-down impedance of open drain N-channel output drivers. He has therefore developed an output driver impedance controller that presents an impedance to the bus that is insensitive to fluctuations in temperature, voltage, fabrication variations, etc., as will be further described below with respect to FIGS. 1–5.

Figure 1:
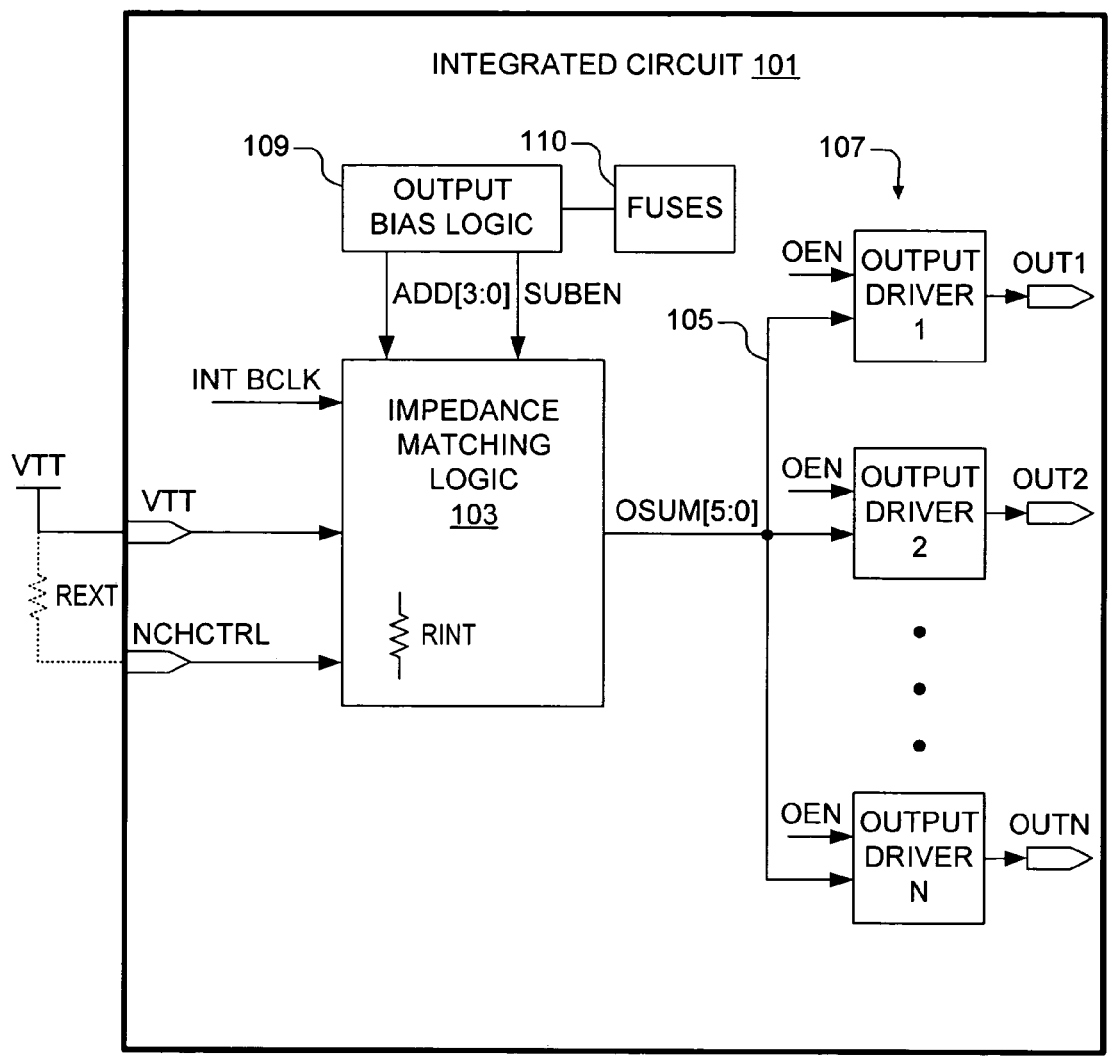
FIG. 1 is a simplified block diagram of an integrated circuit (IC) including an output driver impedance controller according to an exemplary embodiment of the present invention.

FIG. 1 is a simplified block diagram of an integrated circuit (IC) 101 including an output driver impedance controller according to an exemplary embodiment of the present invention. The IC 101 includes several externally-available input/output (I/O) pins, including a bus voltage input pin VTT, an N-channel control pin NCHCTRL, and multiple output pins shown as OUT1, OUT2, . . . , OUTN where N is a positive integer. An external voltage signal VTT providing a reference bus voltage level is provided on pin VTT, such as, for example, 1.5 Volts (V). In one embodiment, an optional external reference resistor REXT, shown in dashed lines, is coupled between pins VTT and NCHCTRL. If the REXT resistor is not provided, then an internal resistor RINT is used instead as the default reference resistor, as further described below. In a specific embodiment, the REXT resistor is 14 ohms and may be a precision resistor or the like (e.g., a 1% resistor). The RINT resistor is also a 14 ohm precision resistor in the specific embodiment.

The IC 101 includes impedance matching logic 103 which monitors the impedances of the selected reference resistor and an internal impedance generator. In the embodiment shown, the impedance matching logic 103 monitors the voltage levels of the VTT and NCHCTRL pins. The impedance matching logic 103 provides a 6-bit digital value OSUM[5:0] over a 6-bit internal bus 105 to multiple output drivers 107 provided on the IC 101, where the output drivers 107 are individually numbered from 1 to N. Each of the individual output drivers 107 is coupled to a corresponding one of the output pins, individually shown as OUT1, OUT2, . . . , OUTN. Within each of the output drivers 107, each bit of the OSUM[5:0] value enables/disables a corresponding group of an array of matched N-channel devices having a common drain point and employed to drive the corresponding OUTx pin (where "x" is a number from 1 to N denoting a particular output pin). The OSUM[5:0] value is qualified by an output enable signal OEN having a state that is set according to the desired output state for that output driver. The OEN signal is provided by device logic (not shown) to set the state of the output signal of the corresponding output pin OUTx, where the output signals OUTx assume the same name as the output pins, i.e., output pin OUT1 asserts respective output signal OUT1, output pin OUT2 asserts output signal OUT2, etc. The OSUM[5:0] value specifies the number of open drain N-channel devices that are to be turned on (or activated) within each of the output drivers 107 when the corresponding OUT signal is a logic low. In one embodiment, the 6-bit bus 105 allows for adjustment of the impedance of the output drivers in 64 equally-spaced steps.

In operation, the impedance matching logic 103 maintains a local binary array of matched N-channel devices that is substantially identical to the binary array in each of the output drivers 107. Each of the arrays are organized or divided into binary groups for digital output impedance control, as further described below. The impedance of the local binary array within the impedance matching logic 103 is continually monitored and the OSUM[5:0] value is adjusted up or down so that the voltage across the internal array is within a predetermined tolerance of the voltage across the selected reference resistor, which is either the REXT resistor or the RINT resistor. In one embodiment, the predetermined tolerance is an error voltage of approximately 50 milli-volts (mV). If the resistor REXT is not connected so that no voltage is present across VTT and NHCTRL pins, then the impedance matching logic 103 enables the RINT resistor that is used instead as the reference for setting the impedance of the output drivers 107. In one embodiment, the optimum impedance of the output drivers 107 is determined every two cycles of a bus clock, INT BCLK, and the output drivers 107 are transparently updated.

Output bias logic 109 is provided to add or subtract bias to the OSUM[5:0] value provided over the bus 105. A 4-bit value ADD[3:0] is provided from the output bias logic 109 to the impedance matching logic 103 to identify an amount to be added to or subtracted from the OSUM[5:0] value. A control signal SUBEN provided by the output bias logic 109 to the impedance matching logic 103 determines whether the amount is to be added (when SUBEN is not asserted) or subtracted (when SUBEN is asserted). In one embodiment, the ADD[3:0] value is directly added to (e.g., when SUBEN is logic 0 or not asserted) or otherwise directly subtracted from (e.g., when SUBEN is logic 1 or asserted) the OSUM[5:0] value. In an alternative embodiment, the OSUM[5:0] value is proportionally increased or decreased according to the value of ADD[3:0] and the SUBEN signal. For example, if ADD[3:0] is set at 1000b (binary) and the SUBEN signal is not asserted, then the OSUM[5:0] is increased by 50 percent.

In a particular embodiment, the output bias logic 109 includes or is otherwise programmed by a set of fuses 110 incorporated on the IC 101. For example, the programmed state of the set of fuses 110 is determined by a test procedure or the like on a part-by-part basis. All but one of the set of fuses 110 corresponds to lower bits of OSUM[5:0] value. In this manner, blowing selected fuses allows a designer to increase or decrease the of OSUM[5:0] value. The output bias logic 109 is thus a control mechanism that enables a designer to change output levels if desired. In one embodiment, the output bias logic 109 is employed to provide more or less noise immunity for corresponding outputs.

Figure 2:
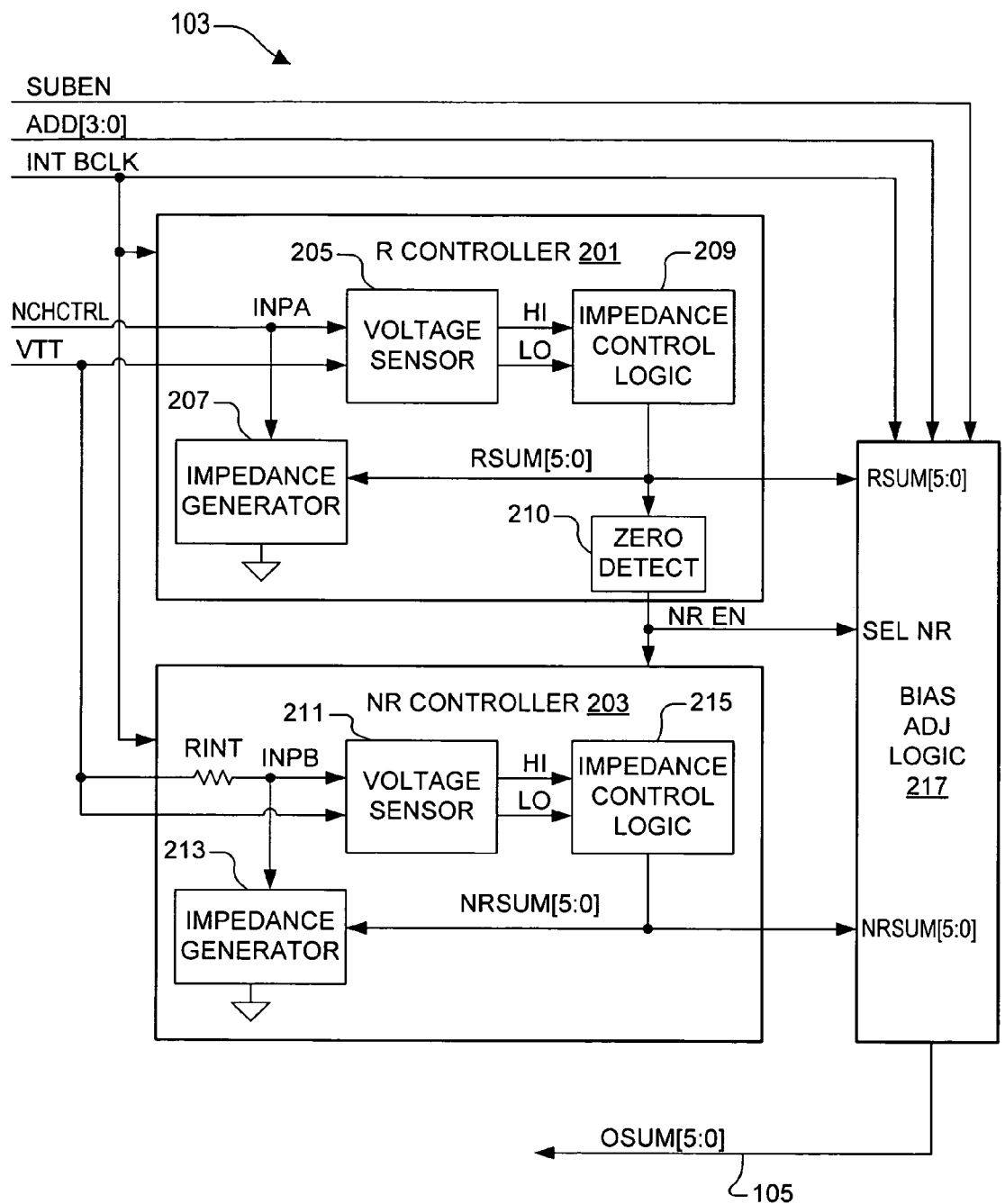
FIG. 2 is a more detailed block diagram of the impedance matching logic of FIG. 1 according to an exemplary embodiment of the present invention.

FIG. 2 is a more detailed block diagram of the impedance matching logic 103 according to an exemplary embodiment of the present invention. The impedance matching logic 103 includes an R controller 201 and an NR controller 203, which are substantially similar. The R controller 201 and the NR controller 203 both receive the INT BCLK signal. The R controller 201 includes a voltage sensor 205 that monitors the voltage of the VTT and NCHCTRL pins, where the NCHCTRL is shown locally as a signal INPA. The INPA signal is provided to an impedance generator 207 referenced to ground, which presents an impedance between the INPA signal and ground based on an input control value RSUM[5:0]. The voltage sensor 205 effectively compares the voltage between the VTT and NCHCTRL pins with the voltage from the NCHCTRL pin to ground and generates signals HI and LO to impedance control logic 209 in an attempt to equalize the voltage levels within a predetermined tolerance. The impedance control logic 209 increments/decrements the RSUM[5:0] value to control the impedance of the impedance generator 207 until VTT−INPA=INPA within the predetermined error voltage (or so that the voltage of the INPA signal is one-half the voltage of VTT). In other words, assuming that the REXT resistor is externally coupled, the voltage sensor 205 and the impedance control logic 209 cooperate in attempt to equalize the voltage across the impedance generator 207 with the voltage across the REXT resistor within the predetermined error voltage.

When the REXT resistor is externally coupled, the VTT source voltage is divided by the REXT resistor and the impedance of the impedance generator 207 to provide a corresponding voltage on the INPA signal. If the voltage of the INPA signal is too high indicating that the impedance of the impedance generator 207 is too high (or greater than REXT), then the voltage sensor 205 asserts the HI signal and negates the LO signal. The impedance control logic 209 responds by incrementing the RSUM[5:0] value to reduce the value of the impedance generator 207. The voltage sensor 205 asserts the LO signal and negates the HI signal when the impedance of the impedance generator 207 is too low. The impedance control logic 209 responds by decrementing the RSUM[5:0] value to increase the impedance value. In the embodiment shown and described, the RSUM [5:0] value is inversely proportional to the impedance of the impedance generator 207, although a proportional relationship is also contemplated.

In one embodiment, the voltage sensor 205 includes a pair of sense amplifiers (not shown) having voltage reference settings separated by the predetermined error voltage relative to one-half the voltage of VTT. In this case, a high sense amplifier is set to about one-half the error voltage above ½ VTT for controlling the HI signal and the low sense amplifier is set to one-half the error voltage below ½ VTT for controlling the LO signal. Each sense amplifier compares the voltage of the INPA signal relative to its set point. If the voltage of the INPA signal rises above one-half the error voltage, then HI is asserted, if INPA falls below one-half the error voltage, then LO is asserted, and if INPA is within one-half of the error voltage of ½ VTT, then neither HI or LO is asserted and no action is taken. In a more specific embodiment, the predetermined error voltage is approximately 50 mV so that the high sense amplifier is set to approximately 25 mV above ½ VTT while the low sense amplifier is set to approximately 25 mV below ½ VTT. The gap of the error voltage can be set for a tight tolerance for greater accuracy or otherwise set to a relatively wide tolerance to save power.

In one embodiment, the impedance control logic 209 is a digital circuit controlled by the INT BCLK signal, and adjusts (e.g., increments or decrements) the RSUM[5:0] value during selected cycles of the INT BCLK signal, such as every clock cycle or every other clock cycle, etc.

The R controller 201 further includes zero detect logic 210, which receives the RSUM[5:0] value and provides a signal NR EN to bias adjustment logic 217 and to the NR controller 203. When the zero detect logic 210 detects a value of RSUM[5:0] indicating that the resistor REXT is not installed, then the NR EN signal is asserted enabling the NR controller 203. In the embodiment shown, if the REXT resistor is not connected, then the NCHCTRL signal tends to float low towards the ground voltage level causing the voltage sensor 205 to continually assert the LO signal. The impedance control logic 209 responds by repeatedly decrementing the RSUM[5:0] value in an attempt to increase the impedance of the impedance generator 207 to increase the voltage of the INPA signal. Yet since the INPA signal still tends towards zero, the RSUM[5:0] value is decremented to zero (e.g., 000000b) causing the zero detect logic 210 to assert the NR EN signal, effectively enabling the NR controller 203 and disabling the R controller 201.

The NR controller 203 includes a voltage sensor 211, an impedance generator 213 and impedance control logic 215 that are substantially the same and that operate in substantially the same manner as the voltage sensor 205, the impedance generator 207 and the impedance control logic 209. In this case, however, the VTT pin is provided to the voltage sensor 211 and to one end of the resistor RINT, having its other end generating a signal INPB provided to another input of the voltage sensor 211. The impedance control logic 215 generates a control value NRSUM[5:0] to the impedance generator 213. In this case, the voltage sensor 211 and the impedance control logic 215 cooperate in attempt to equalize the voltage across the impedance generator 213 with the voltage across the RINT resistor within the predetermined error voltage in a similar manner as described for the R controller 201.

The RSUM[5:0] value, the NRSUM[5:0] value, and the NR EN signal are provided to RSUM[5:0], NRSUM[5:0] and SEL NR inputs of the bias adjustment logic 217, respectively. The INT BCLK and SUBEN signals and the ADD[5:0] value are also provided to the bias adjustment logic 217. The NR EN signal directs the bias adjustment logic 217 to use the 6-bit SUM value from either the R controller 201 (e.g., RSUM[5:0]) or the NR controller 203 (e.g., NRSUM[5:0]). During selected cycles of the clock signal INT BCLK, such as every other clock cycle or the like, the bias adjustment logic 217 also adjusts (e.g, increases or decreases) the value of the selected SUM value based on the ADD[3:0] value and the control signal SUBEN. As previously described, in one embodiment the ADD[3:0] value is either added to or subtracted from the selected SUM value and in another embodiment, the selected SUM value is either proportionally increased or decreased according to the ADD[3:0] value. The final result is asserted by the bias adjustment logic 217 as the OSUM[5:0] value on the bus 105 of the IC 101. In this manner, the OSUM[5:0] value is a bias-adjusted version of the selected one of the RSUM[5:0] and NRSUM[5:0] values.

Figure 3:
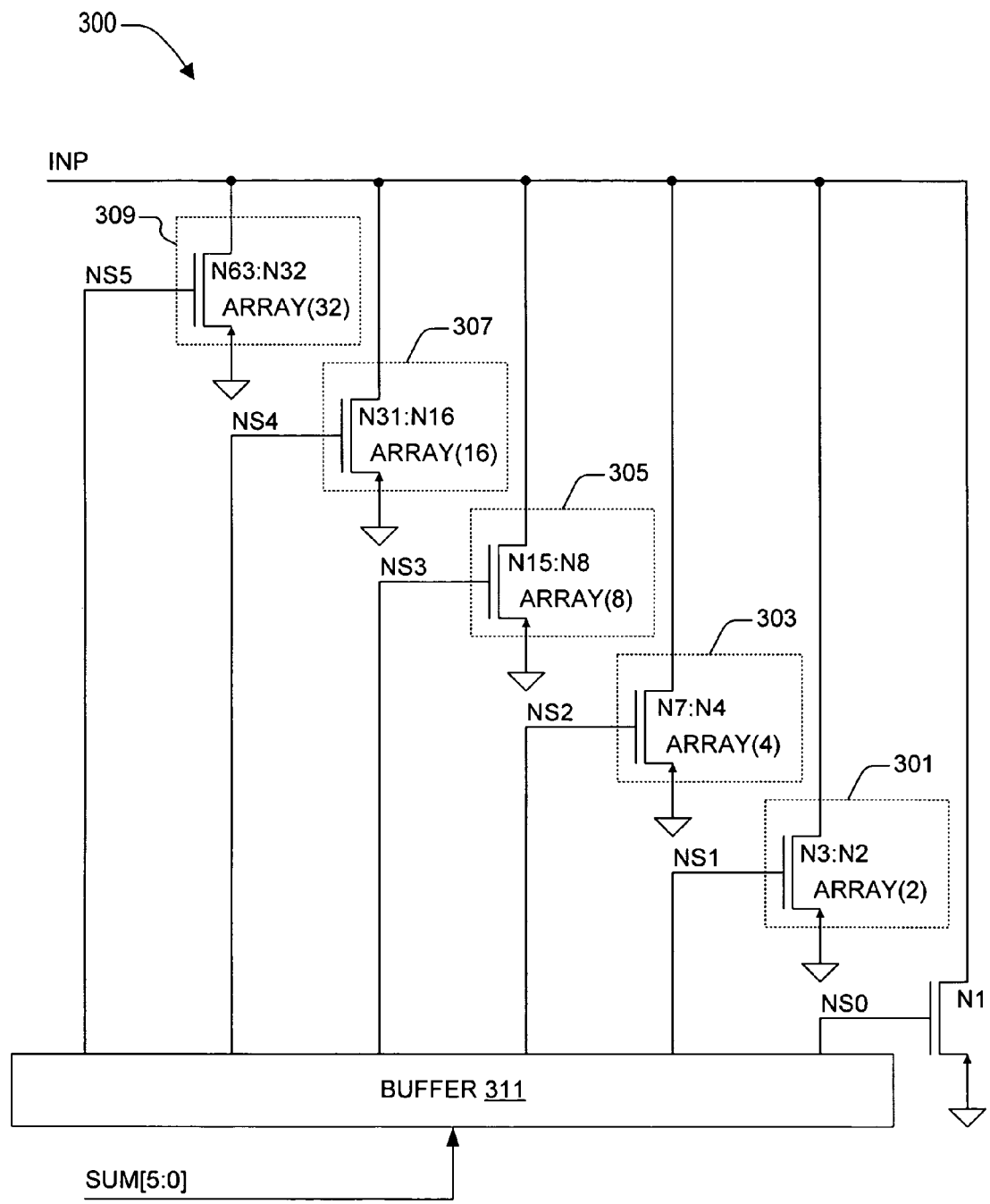
FIG. 3 is a schematic diagram of an impedance generator 300 implemented according to an exemplary embodiment of the present invention, which may be used as either or both of the impedance generators of FIG. 2.

FIG. 3 is a schematic diagram of an impedance generator 300 implemented according to an exemplary embodiment of the present invention, which may be used as either or both of the impedance generators 207, 213. The impedance generator 300 includes a binary array of 63 N-channel devices N1–N63 (or N63:N1). In one embodiment, each of the N-channel devices N63:N1 are matched so that the drain to source impedance is substantially the same. The source of each of the devices N63:N1 is coupled to ground and its drain is coupled to a signal INP, which represents the INPA signal of the impedance generator 207 or the INPB signal of the impedance generator 213. The devices N63:N1 are binarily grouped to correspond to each of the six bits of a binary impedance value SUM[5:0], which represents the RSUM[5:0] value from the impedance generator 207 or the NRSUM[5:0] value from the impedance generator 213. A first array group is the sole device N1 having a gate which receives a signal NS0, a second array group 301 includes two devices N2 and N3 (N3:N2) each having gates receiving a signal NS1, a third array group 303 includes four devices N4–N7 (N7:N4) each having gates receiving a signal NS2, a fourth array group 305 includes eight devices N8–N15 (N15:N8) each having gates receiving a signal NS3, a fifth array group 307 includes 16 devices N16–N31 (N31:N16) each having gates receiving a signal NS4, and a sixth array group 309 includes 32 devices N32–N63 (N63:N31) each having gates receiving a signal NS5.

The NS5–NS0 signals form a binary value NS[5:0] asserted by a buffer 301, which receives the SUM[5:0] value. Each bit of the NS[5:0] value is a buffered version of the corresponding bit of the SUM[5:0] value. For example, the SUM5 bit is buffered to generate the NS5 bit, the SUM4 bit is buffered to generate the NS4 bit, and so on. Thus, as the SUM[5:0] value is incremented or increased, the impedance of the INP signal is decreased and vice-versa. For example, a SUM[5:0] value of 100000b activates the array group 309 coupling approximately half (or 32) of the N-channel devices in parallel, while a SUM[5:0] value of 100001b activates array groups N1 and 309 coupling 33 of the N-channel devices in parallel, while a SUM[5:0] value of 100010b activates array groups 303 and 309 coupling 34 of the N-channel devices in parallel, and so on. A SUM[5:0] value of 000000b turns off all of the N-channel devices for a high impedance state while a value of 111111b activates all 63 of the N-channel devices for the lowest impedance level. In one embodiment, the array of devices N63:N1 are sized and grouped to provide a pull-down impedance ranging from approximately 4 to 24 ohms for the expected range of operating temperatures and bus voltage conditions, leaving margin as well for anticipated fabrication process variations.

Figure 4:
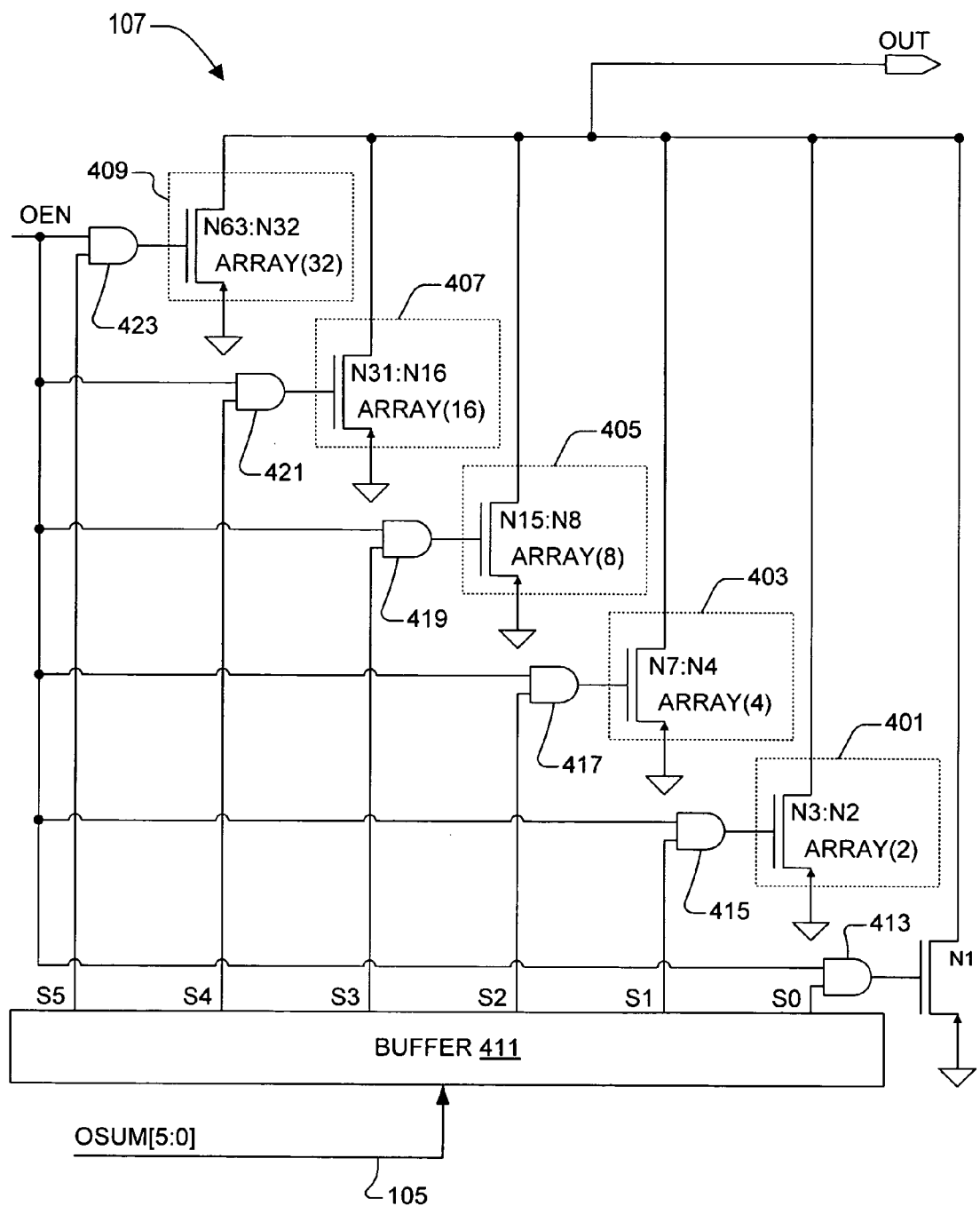
FIG. 4 is a schematic diagram of an exemplary embodiment of each of the output drivers of FIG. 1 according to the present invention.

FIG. 4 is a schematic diagram of an exemplary embodiment of each of the output drivers 107 according to the present invention. The output driver 107 includes an array of 63 N-channel devices N63:N1 implemented and binarily grouped in substantially identical manner as the devices N63:N1 of each of the impedance generators 207 and 213. The N-channel devices N63:N1 are matched and each includes a source coupled to ground and a drain coupled to an output signal OUT, which represents any one of the OUT1–OUTN output pins of the corresponding output driver 1–N being implemented. As shown, a first array group includes device N1, a second array group 401 includes two devices N3:N2, a third array group 403 includes four devices N7:N4, a fourth array group 405 includes eight devices N15:N8, a fifth array group 407 includes 16 devices N31:N16 and a sixth array group 409 includes 32 devices N63:N32.

The OSUM[5:0] value on bus 105 is provided to each of the output drivers 107 on the IC 101, and within each output driver 107, to buffer logic 411. The buffer logic 411 is configured in substantially the same manner as the buffer logic 311 and outputs a value S[5:0], where each bit of the S[5:0] value from the buffer logic 411 is a buffered version of the corresponding bit of the OSUM[5:0] value. The S0–S5 bit signals are each provided to one input of a corresponding one of an array of two-input AND gates 413, 415, 417, 419, 421 and 423, respectively. The other input of each of the AND gates 413–423 receives the OEN signal. The output of the AND gate 413 is coupled to the gate of device N1, the output of the AND gate 415 is coupled to the gates of devices N3:N2, the output of the AND gate 417 is coupled to the gates of devices N7:N4, the output of the AND gate 419 is coupled to the gates of devices N15:N8, the output of the AND gate 421 is coupled to the gates of devices N31:N16, and the output of the AND gate 423 is coupled to the gates of devices N63:N32.

The OUT signal at the output of the output driver 107 is placed in a high impedance state when the OEN signal is asserted low to a logic 0 since all of the N-channel devices are turned off. When the OEN signal is asserted high to a logic 1, then the output driver 107 operates in substantially the same manner as the impedance generator 300. In this case, the number of N-channel devices coupled in parallel decreases (or otherwise increases) in response to decreasing (or otherwise increasing) the OSUM[5:0] value, thereby effectively increasing (or otherwise decreasing) the impedance applied to the OUT signal.

In summary and with reference to the impedance matching logic 103 shown in FIG. 2, when the REXT resistor is externally coupled between the NCHCTRL and VTT pins, then the R controller 201 adjusts the RSUM[5:0] value until the impedance generator 207 has an impedance approximating the resistance of the resistor REXT. The bias adjustment logic 217 adjusts the value of RSUM[5:0] by an amount indicated by the SUBEN signal and ADD[3:0] value and asserts the bias-adjusted OSUM[5:0] value. Otherwise, if the REXT resistor is not coupled, then the NR controller 203 adjusts the value of NRSUM[5:0] until the impedance generator 213 has an impedance approximating the resistance of the resistor RINT. The bias adjustment logic 217 adjusts the value of NRSUM[5:0] by an amount indicated by the SUBEN signal and ADD[3:0] value and asserts the bias-adjusted OSUM[5:0] value. Referring back to the IC 100 shown in FIG. 1, the OSUM[5:0] value is distributed to all of the output drivers 107, where each output driver 107 is configured with matching N-channel devices binarily distributed in substantially the same manner as the N-channel devices the impedance generators 207 and 213. Thus, the impedance applied to each of the OUTN signals is approximately equal to the reference resistor REXT or RINT.

FIG. 5 is a flowchart diagram illustrating a method of controlling pull-down impedance of at least one output driver according to an exemplary embodiment of the present invention. At first block 501, an optional bias adjust value is programmed. In the specific IC embodiment as previously described, blowing selected fuses incorporated on the IC 101 provides a control mechanism to compensate for process variations across the IC 101. At next block 503, an internal reference resistor may be provided as a default reference for some embodiments, or in the event the external reference resistor is not provided, or if it is desired to provide a design choice. If provided, the method includes detecting the externally-coupled reference resistor and selecting between the internal and external resistors (e.g., selecting the internal resistor if the external resistor is not detected).

At next block 505, a reference voltage is applied to a selected reference resistor and a reference impedance generator having a reference impedance input. In the embodiment illustrated, the reference voltage is the bus voltage, which is applied across the reference resistor and the reference impedance input coupled in series. At next block 507, the reference impedance input is periodically (e.g., continuously) adjusted to equalized impedance of the reference impedance generator with the reference resistor within a predetermined tolerance. In the illustrated embodiment, a voltage is sensed at a common junction between the reference resistor and the reference impedance generator and compared with one-half the input bus voltage (e.g., VTT). At next block 509, selected ones of a binary array of matched impedance devices of the reference impedance generator are activated based on the reference impedance input. In the illustrated embodiment, the reference impedance input is a digital value in which each bit activates a selected group of an array of matched N-channel devices.

At next block 511, the output impedance input provided to each output impedance generator is controlled based on the reference impedance input. If a bias adjust value is programmed, the bias adjust value is combined with the reference impedance input to adjust the output impedance input at next block 513. In the illustrated embodiment, the bias adjustment logic 217 incorporates (adds, subtracts, or otherwise combines) the ADD[5:0] value to the selected SUM[5:0] value to generate the OSUM[5:0] value routed to each of the output drivers 107. At next block 515, selected ones of a binary array of matched impedance devices of the output impedance generator are activated based on the output impedance input. As previously described, each of the output drivers 107 includes the same configuration of matched N-channel devices as either of the reference impedance generators 207, 213, so that the output impedance is based on the reference impedance and any output bias adjustment. Finally, at last block 517, the outputs are enabled or disabled using an output enable signal.

An output driver impedance controller according to embodiments of the present invention continuously adjusts the impedance of each output driver of an IC during operation in a transparent manner. The impedance is continuously monitored and adjusted to compensate for temperature, voltage, and fabrication process variations in a manner that is transparent to the primary operation of the circuit. Fluctuations of the VTT signal do not affect the impedance of the output drivers since the variations occur in proportional manner to the INPA or INPB signals. The REXT resistor provides the advantage over the RINT resistor of being completely independent of the temperature variations of the IC 101.

Although the present invention has been described in considerable detail with reference to certain preferred versions thereof, other versions and variations are possible and contemplated. For example, various alternative methods are contemplated for equalizing impedance of the programmable impedance generators 207, 213 with the reference resistor, such as current techniques or the like. Moreover, although the present disclosure contemplates one implementation using metal-oxide semiconductor (MOS) type devices, including complementary MOS devices and the like, such as, for example, NMOS and PMOS transistors, it may also be applied in a similar manner to different or analogous types of technologies and topologies, such as bipolar devices or the like.

Finally, those skilled in the art should appreciate that they can readily use the disclosed conception and specific embodiments as a basis for designing or modifying other structures for providing out the same purposes of the present invention without departing from the spirit and scope of the invention as defined by the appended claims.

The invention claimed is:

1. An output driver impedance controller that controls pull-down impedance of at least one output based on a reference value, comprising:
    an internal reference value and an external reference value;
    a programmable reference impedance generator that develops a reference impedance controlled by a reference impedance control input;
    at least one output driver, each including a programmable output impedance generator coupled to a corresponding output and controlled by an output impedance control input; and
    an impedance matching controller that continually adjusts said reference impedance control input to match said reference impedance with a selected one of said first and second reference values within a predetermined tolerance and that generates said output impedance control input based on said reference impedance control input.

2. The output driver impedance controller of claim 1, wherein said programmable reference impedance generator and each of said at least one programmable output impedance generator comprises a binary array of matched impedance devices.

3. The output driver impedance controller of claim 2, wherein said binary array of matched impedance devices comprises matched N-channel devices.

4. The output driver impedance controller of claim 1, wherein said impedance matching controller comprises:
    a voltage sensor that senses a voltage difference between a reference voltage based on an input bus voltage and a voltage of said programmable reference impedance generator and that asserts an error signal indicative thereof; and
    impedance control logic that adjusts said reference impedance control input based on said error signal.

5. The output driver impedance controller of claim 4, wherein said input bus voltage is applied across said selected one of said first and second reference resistors and said programmable reference impedance generator coupled in series.

6. The output driver impedance controller of claim 4, wherein said impedance control logic receives a clock signal and increments or decrements said reference impedance control input during selected cycles of said clock signal.

7. The output driver impedance controller of claim 1, further comprising bias adjustment logic that combines a bias amount with said reference impedance control input to provide said output impedance control input.

8. The output driver impedance controller of claim 7, further comprising output bias logic that is programmed to provide said bias amount.

9. The output driver impedance controller of claim 1, wherein said impedance matching controller comprises:
    a first controller for coupling to an external reference resistor that provides said first reference value; and
    a second controller including an internal reference resistor that provides said second reference value.

10. The output driver impedance controller of claim 9, wherein said first controller includes detection logic that monitors said reference impedance control input to determine whether said first reference value is coupled and that enables said second controller if said first reference value is not coupled.

11. The output driver impedance controller of claim 1, wherein each said at least one output driver includes output enable logic.

12. An integrated circuit (IC), comprising:
    a plurality of pins including a first reference pin for receiving a reference voltage and at least one output pin;
    at least one output driver, each including a programmable output impedance generator controlled by an output impedance control input and coupled to drive a corresponding one of said at least one output pin; and
    impedance matching logic, comprising:
        an external reference resistor coupled to said first reference pin;
        an internal reference resistor;
        a programmable reference impedance generator controlled by a reference impedance control input;
        comparator logic that continually adjusts said reference impedance control input to equalize values of a selected one of said internal and external reference resistors and said programmable reference impedance generator within a predetermined tolerance; and
        output logic that controls said output impedance control input based on said reference impedance control input.

13. The IC of claim 12, wherein said reference voltage is applied across a series coupling of said selected one of said internal and external reference resistors and said programmable reference impedance generator and wherein said comparator logic attempts to equalize voltages within a predetermined voltage tolerance.

14. The IC of claim 12, further comprising a second reference pin coupled to said programmable reference impedance generator and for coupling to one end of said external reference resistor having its other end coupled to said first reference pin.

15. The IC of claim 14, wherein said impedance matching logic comprises:
   said internal reference resistor having a first end coupled to said first reference pin and a second end;
   said programmable reference impedance generator including a first programmable reference impedance generator controlled by a first reference impedance control input and coupled to said second reference pin and a second programmable reference impedance generator controlled by a second reference impedance control input and coupled to said second end of said internal reference resistor;
   said comparator logic including first comparator logic that adjusts said first reference impedance control input in an attempt to equalize voltages of said external reference resistor and of said first programmable reference impedance generator within a first tolerance, and second comparator logic tat adjusts said second reference impedance control input in an attempt to equalize voltages of said internal reference resistor and of said second programmable reference impedance generator within a second tolerance;
   detection logic that monitors said first reference impedance control input for detecting presence of said external reference resistor and providing an enable signal indicative thereof; and
   said output logic selecting one of said first and second reference impedance control inputs based on said enable signal for providing said output impedance control input.

16. The IC of claim 15, further comprising:
   output bias logic that provides an adjustment value; and
   said output logic comprising bias adjustment logic that combines said reference impedance control input with said adjustment value to provide said output impedance control input.

17. The IC of claim 16, wherein said output bias logic comprises a plurality of fuses.

18. The IC of claim 12, wherein said programmable reference impedance generator and each said programmable output impedance generator comprises a binary array of matched N-channel impedance devices.

19. The IC of claim 12, wherein said comparator logic comprises:
   a voltage sensor, coupled to said first reference pin and to said programmable reference impedance generator, that detects voltages across said selected one of said internal and external reference resistors and said programmable reference impedance generator and that asserts an error signal indicative thereof; and
   impedance control logic that adjusts said reference impedance control input based on said error signal.

20. The IC of claim 19, said reference impedance control input comprising a digital value, wherein said impedance control logic receives a clock signal and increments or decrements said reference impedance control input in response to selected cycles of said clock signal.

21. A method of controlling pull-down impedance of at least one output driver, comprising:
   providing an internal reference resistor for use when an external reference resistor is unavailable;
   selecting between the internal and external reference resistors;
   applying a reference voltage to the selected reference resistor and a reference impedance generator having a reference impedance input;
   periodically adjusting the reference impedance input to equalize impedance of the reference impedance generator with the selected reference resistor within a predetermined tolerance; and
   controlling an output impedance input of at least one output impedance generator based on the reference impedance input, each output impedance generator coupled to a corresponding output driver.

22. The method of claim 21, further comprising:
   sensing voltage at a common junction of the reference impedance generator and the selected reference resistor coupled in series with the reference voltage; and
   said periodically adjusting comprising comparing the voltage at the common junction with one-half of the reference voltage.

23. The method of claim 21, further comprising:
   detecting whether the external reference resistor is provided and providing an enable signal indicative thereof; and
   selecting between the internal and external reference resistors based on the enable signal.

24. The method of claim 21, wherein said periodically adjusting the reference impedance input comprises incrementing or decrementing a digital value during selected cycles of a clock signal.

25. The method of claim 21, further comprising:
   programming a bias adjust value; and
   said controlling an output impedance input comprising combining the bias adjust value with the reference impedance input.

26. The method of claim 21, further comprising enabling or disabling each output driver based on an output enable signal.

27. The method of claim 21, further comprising:
   activating selected ones of a binary array of matched impedance devices of the reference impedance generator based on the reference impedance input; and
   activating selected ones of a binary array of matched impedance devices of each output impedance generator based on the output impedance input.

* * * * *